United States Patent
Wynne et al.

(10) Patent No.: US 7,288,940 B2
(45) Date of Patent: Oct. 30, 2007

(54) GALVANICALLY ISOLATED SIGNAL CONDITIONING SYSTEM

(75) Inventors: John Wynne, Limerick (IE); Eamon Hynes, Limerick (IE)

(73) Assignee: Analog Devices, Inc., Norwood, MA (US)

( * ) Notice: Subject to any disclaimer, the term of this patent is extended or adjusted under 35 U.S.C. 154(b) by 179 days.

(21) Appl. No.: 11/005,608

(22) Filed: Dec. 6, 2004

(65) Prior Publication Data

US 2006/0153495 A1    Jul. 13, 2006

(51) Int. Cl.
*G01R 31/02* (2006.01)
*B81B 7/02* (2006.01)
*B81B 7/04* (2006.01)

(52) U.S. Cl. ............... 324/415; 324/76.66; 324/627
(58) Field of Classification Search ........... 324/415, 324/76.66, 705, 658, 678
See application file for complete search history.

(56) References Cited

U.S. PATENT DOCUMENTS

| | | | |
|---|---|---|---|
| 3,940,678 A | 2/1976 | Koyama | |
| 4,217,543 A * | 8/1980 | Strong | 324/710 |
| 5,163,754 A | 11/1992 | Fasching | |
| 5,481,199 A * | 1/1996 | Anderson et al. | 324/705 |
| 5,522,865 A | 6/1996 | Schulman et al. | |
| 6,052,287 A * | 4/2000 | Palmer et al. | 361/767 |
| 6,169,444 B1 | 1/2001 | Thurber, Jr. | |
| 6,362,626 B2 | 3/2002 | Furukawa | |
| 6,362,627 B1 | 3/2002 | Shimamoto et al. | |
| 6,376,787 B1 * | 4/2002 | Martin et al. | 200/181 |
| 6,410,371 B1 * | 6/2002 | Yu et al. | 438/151 |
| 6,429,632 B1 * | 8/2002 | Forbes et al. | 323/282 |
| 6,512,411 B2 | 1/2003 | Meng et al. | |
| 6,646,442 B2 * | 11/2003 | Katoh | 324/433 |
| 6,969,913 B2 * | 11/2005 | Shirakawa et al. | 257/777 |
| 6,975,193 B2 * | 12/2005 | Knieser et al. | 335/78 |
| 7,078,908 B2 * | 7/2006 | Fujita et al. | 324/433 |
| 7,230,555 B2 * | 6/2007 | Dolazza et al. | 341/143 |
| 2007/0024270 A1 * | 2/2007 | Kawamura | 324/140 R |

OTHER PUBLICATIONS

Agilent HCPL-7800A/HCPL-7800 *Isolation Amplifier* Data Sheet, 18 pages, Mar. 10, 2004.
Agilent HCPL-788J, *Isolation Amplifier with Short Circuit and Overload Detection*, 21 pages, Mar. 12, 2004.
Agilent HCPL-7840 *Isolation Amplifier* Technical Data, 19 pages, Jan. 27, 2004.
Agilent HCPL-7510 *Isolated Linear Sensing IC* Data Sheet, 14 pages Jul. 8, 2003.
Aglient *High CMR Isolation Amplifier for Current Sensing Applications*, Application Note 1059, 12 pages, 1999.
Agilent, *Overview of High Performance Analog Optocouplers*, Application Note 1357, 10 pages Apr. 16, 2003.

(Continued)

*Primary Examiner*—Anjan Deb
(74) *Attorney, Agent, or Firm*—Iandiorio & Teska

(57) ABSTRACT

A galvanically isolated signal conditioning system includes a signal conditioning circuit on an integrated circuit chip; a flying capacitor; and a galvanically isolating MEMS switching device on an integrated circuit chip for selectively switching the flying capacitor from across a pair of input terminals in one state to across the input terminals of the signal conditioning circuit in another state.

21 Claims, 16 Drawing Sheets

OTHER PUBLICATIONS

Agilient HCPL-7520 *Isolated Linear Sensing* IC Data Sheet, 14 pages, Jul. 8, 2003.

Agilient *15-bit A/D Converter* Technical Data, 29 pages, May 2000.

Burr-Brown Products from Texas Instruments, *Precision Lowest-Cost Isolation Amplifier*, ISO124, 12 pages, SBPSP74B-Sep. 1997-Revised Apr. 2003.

Burr-Brown, *High Common-Mode Voltage Difference Amplifier*, INA117, 14 pages, Jul. 1995.

McEldowney, Justin, Burr-Brown Corp., *Instrumentation Amp Addresses Power-Miser Circuit Applications*, pp. 141-150, EDN , Jan. 23, 1986.

Linear Technology, LTC 1043 *Dual Precision Instrumentation Switched Capacitor Building Block*, 16 pages, 1985.

Linear Technology, LTC 2053, *Precision, Rail-to-Rail Input and Output, Zero-Drift Instrumentation Amplifier with Resistor-Programmable Gain*, 8 pages Dec. 2001.

Linear Technology, LTC 6800, *Rail -to -Rail Input and Output Instrumentation Amplifier*, 12 pages, 2002.

Lenhard, F., *New Current Sensors for Motor Drives*, PCIM Europe, pp. 184-186, Sep. 1989.

Etter, Marcel and Friot, Michel, *Wide Bandwidth, Accurate Current and Voltage Transducers*, PCIM Europe, pp. 304-307, Nov.-Dec. 1993.

Friot, Michel, *Toward the Ideal Current Transducer*, PCIM Europe, p. 316-318, Jun. 1997.

*Transducer Interface for Process Control*, Electronic Product Design, p. 21, Nov. 1994.

Drafts, Bill, *Methods of Current Measurement*, Sensors, pp. 99-105, Oct. 1996.

Wayne, Scott, *Findings the Needle in a Haystack*, Analog Dialogue 34-1, 4 pages, 2000.

Analog Devices, *High Common-Mode Voltage Difference Amplifier*, AD629, 12 pages, 2000.

* cited by examiner

GALVANICALLY ISOLATED SIGNAL CONDITIONING SYSTEM

FIELD OF THE INVENTION

This invention relates to a galvanically isolated signal conditioning system, and more particularly to such a galvanically isolated signal conditioning system employing a MEMS switched flying capacitor.

BACKGROUND OF THE INVENTION

Signal conditioning circuits such as difference amplifiers are often employed in data acquisition applications where isolation is desirable between the potentially much higher voltage of the monitored equipment and the lower voltage of the signal conditioning circuit, for example.

A difference amplifier amplifies the potential difference between its two inputs. Differential signals can be found in many applications, from simple ohmic drops across a sense resistor in a current sensing application to the output of a standard resistive bridge or load cell. Normally the sensed differential voltage is fairly small; usually of the order of microvolts to perhaps hundreds of millivolts.

Usually associated with every differential voltage is a common mode voltage. This common mode voltage can be of an order much, much higher than the differential signal. Each side of the sensed differential signal, when referred to some common potential like zero volts or ground, can be at a voltage potential far above or below the common zero volts or ground. This voltage, which is common to both sides of the sensed differential signal, is called the common mode voltage. This common mode voltage generally contains no useful information about the measurement signal so, ideally, the difference amplifier should amplify only the difference between the signals at its two inputs and ignore or reject the common mode voltage. Depending upon the application, this common mode voltage could be up to several hundreds volts or even higher. It could also be positive or negative with respect to a common point like ground or zero volts.

Additionally in some industries like process control, it is necessary to provide galvanic isolation between the sensed signal and the measuring circuitry. In other words there can be no ac or dc path between the sensed signal which has an associated common mode voltage and the subsequent signal conditioning circuitry which can have a different common mode voltage that is usually zero volts.

To implement an input signal conditioning system capable of meeting all such requirements in the past, a common approach has been to employ a technique called a flying capacitor technique. In this approach a capacitor is switched, either by optically controlled switches, or relays, from across the signal source to across the difference amplifier inputs. By such means the input common mode voltage is removed completely and only the differential input signal is presented to the difference amplifier. This approach can result in a solution which consumes a relatively large area of printed circuit board or printed wire board due to the mechanical relays. Other techniques which have been successful are those that use current transformers and those that are based upon Hall effect current transformers. The disadvantages of the current transformer approach include large physical size and weight, especially as measured current increases, high cost, inability to measure dc currents and voltages and limited accuracy. Disadvantages of the Hall effect approach include low accuracy with an open loop sensor, the need for an isolated power supply to power the isolated side, offsets due to the Hall effect elements and high cost and large physical size for closed loop sensors.

Other approaches that are not based upon a flying capacitor technique are generally based upon a difference amplifier driving an analog-in, analog-out, isolation amplifier. The isolation amplifier is generally transformer-based, employing magnetic coupling to achieve both common mode voltage isolation and signal transmission. Both the difference amplifier and the isolated side of the isolation amplifier are powered from an isolated power supply with a sufficient continuous isolation-voltage rating. Disadvantages of this approach include large physical size, high cost, the need for an isolated power supply to power the isolated side and poor accuracy.

Another approach is to employ an analog to digital converter such as a delta-sigma modulator to digitize an analog input voltage. The digital bit stream from the delta-sigma modulator is then transmitted across an isolation barrier, either an optical barrier—more usual—or a magnetic barrier, and decoded on the far side of the barrier to produce a serial output data stream representing the analog input or, more usually, the transmitted data stream is decoded and converted from the digital domain into the analog domain to produce an analog voltage on the output side of the barrier. Disadvantages of this approach include the need for an isolated power supply to power the isolated side, the need to filter the data stream to extract the sensed signal, high frequency clock and data signals that potentially are a cause of radio frequency interference (RFI), front-end offset drift and gain drift issues over time and temperature, and a relatively expensive low-drift sense resistor.

BRIEF SUMMARY OF THE INVENTION

It is therefore an object of this invention to provide an improved galvanically isolated signal conditioning system.

It is a further object of this invention to provide such an improved galvanically isolated signal conditioning system which effects galvanic isolation using a MEMS switching device with a flying capacitor.

It is a further object of this invention to provide such an improved galvanically isolated signal conditioning system which is small in size and weight, does not physically scale up with measured current, is lower cost, accurate and can measure AC and DC currents and voltages and does not require special power supplies.

It is a further object of this invention to provide such an improved galvanically isolated signal conditioning system in which the signal conditioning circuit and MEMS switching device can be implemented on small stacked or adjacent integrated circuit chips or on one and the same integrated circuit chip made by inexpensive high volume semiconductor processes resulting in a small compact package.

The invention results from the realization that a truly galvanically isolated signal conditioning system which is small, compact, less expensive, and accurate can be effected by using a MEMS switching device to selectively switch a flying capacitor between a higher voltage input and lower voltage signal conditioning circuit where both the MEMS switching device and the signal conditioning circuit are on integrated circuit chips either separate but adjacent or stacked chips or on one and the same chip.

The subject invention, however, in other embodiments, need not achieve all these objectives and the claims hereof should not be limited to structures or methods capable of achieving these objectives.

This invention features a galvanically isolated signal conditioning system including a signal conditioning circuit on an integrated circuit chip and a flying capacitor. A galvanically isolating MEMS switching device on an integrated circuit chip selectively switches the flying capacitor from across a pair of input terminals in one state to across the input terminals of the signal conditioning circuit in another state.

In a preferred embodiment, the signal conditioning circuit may include an analog to digital converter; it may include a difference amplifier circuit. The signal conditioning circuit may include a holding capacitor at its input; the signal conditioning circuit may be on a first chip and the MEMS switching device on a second MEMS chip. The signal conditioning circuit and the MEMS switching device may be on the same chip. When the signal conditioning device and the MEMS switching device are on separate chips the MEMS switching device may be on a SOI chip and the signal conditioning device may be on a CMOS chip. When both are on the same chip that chip may be an SOI chip. The MEMS switching device chip may be mounted on the signal conditioning circuit chip. They may be electrically connected by wire bonding, or by bump-attach mounting techniques. The MEMS switching device chip and the signal conditioning circuit chip may be adjacent to one another and electrically connected by wire bonding or other means. The flying capacitor may be mounted with the MEMS switching device or external to it. The MEMS switching device may be a tested, capped MEMS device. The holding capacitor may be disposed within the MEMS switching device or within the signal conditioning circuit. The holding capacitor may be external to the signal conditioning circuit and the MEMS switching device. The holding capacitor and the flying capacitor may be disposed in the MEMS switching device or it may be external to the MEMS switching device and the signal conditioning circuit. The MEMS switching device may include a pair of cantilevered beams.

BRIEF DESCRIPTION OF THE DRAWINGS

Other objects, features and advantages will occur to those skilled in the art from the following description of a preferred embodiment and the accompanying drawings, in which.

DISCLOSURE OF THE PREFERRED EMBODIMENT

Figure 1:
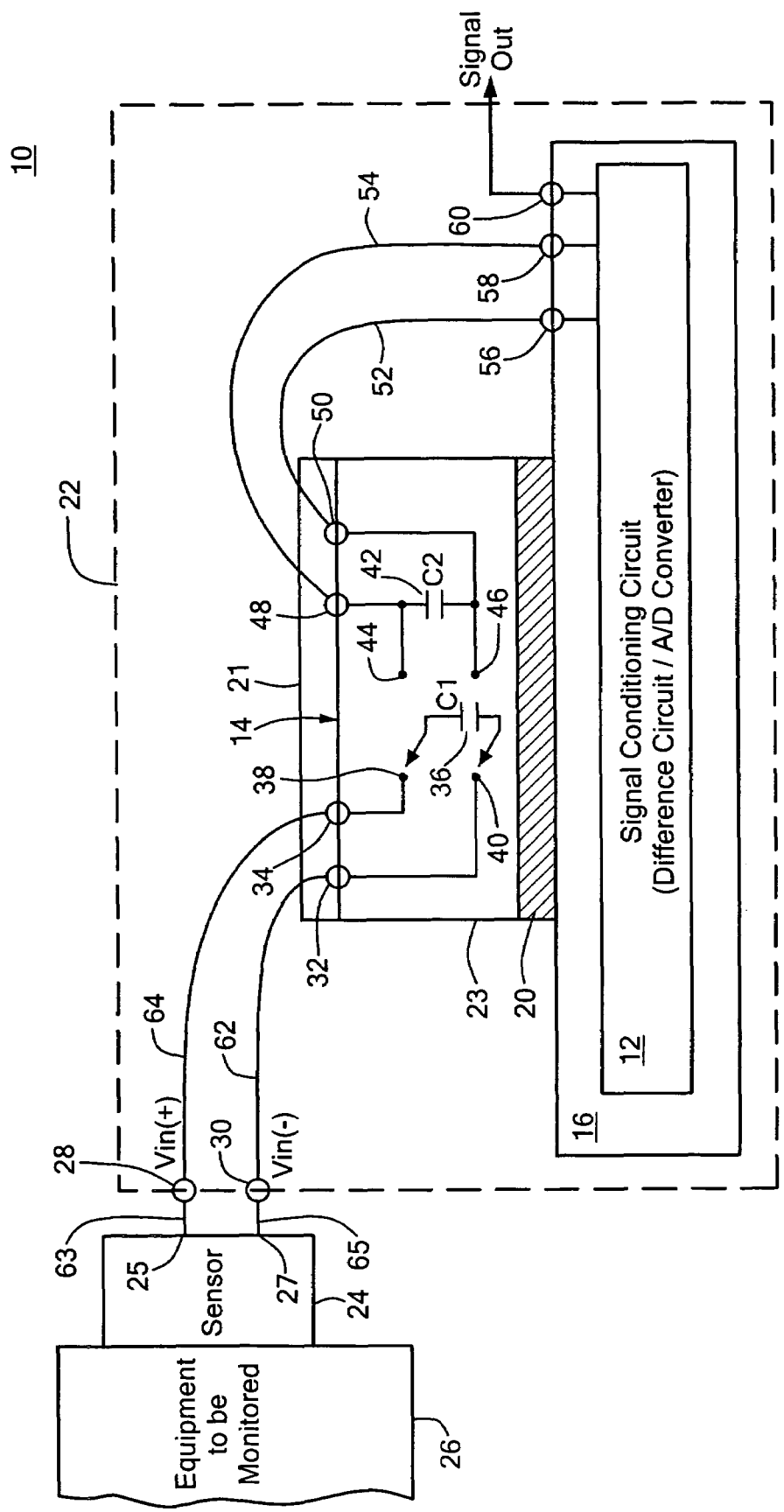
FIG. 1 is a schematic side view of a galvanically isolated signal conditioning circuit according to this invention with the flying capacitor and hold capacitor in the MEMS switching device and the MEMS switching device chip stacked on the signal conditioning circuit chip.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

The improved galvanically isolated signal conditioning system of this invention uses a combination of manufacturing technologies to achieve its advantages. By utilizing switches manufactured using a MEMS-based process, together with a signal conditioning circuit such as an analog to digital converter or a difference amplifier manufactured using standard integrated circuit technology and on a standard integrated circuit production process, it is possible to build a galvanically isolated difference amplifier or analog-to-digital converter system. One path to such a device is to manufacture the MEMS-based switches and difference amplifier or analog-to-digital converter on the same piece of silicon resulting in a wholly integrated solution. This requires that the standard integrated circuit manufacturing process have the capability of incorporating MEMS-based process modules to add the MEMS switches. Such a device can be packaged in a low-cost hermetic package to protect the MEMS switches.

Alternatively, it is possible to manufacture the MEMS switches and the difference amplifier or analog-to-digital converter on separate pieces of silicon, using separate and distinct processes, and bring them together during final manufacturing to provide the user with an integrated solution, e.g. SOI for the MEMS, CMOS for the signal conditioning circuit. Alternatively, the MEMS can be capped and packaged in a plastic package. By using only MEMS switches which have been previously electrically tested to 100% operational yield and capped; by mounting these capped MEMS switches adjacent to or on top of integrated circuits containing dedicated signal conditioning circuitry such as a difference amplifier and/or analog-to-digital converter, it is possible to build a galvanically isolated signal conditioning system which is smaller in size, has a lower manufacturing cost, and offers more reliability than competing non-sigma-delta-based products such as those based on mechanical relays and current transformers. Compared with sigma-delta-based solutions, this solution avoids the need for isolated power supplies, consumes considerably less power, avoids high frequency clock and data signals and eliminates front-end offset and gain drift issues.

Both capacitors used in the front-end flying capacitor structure may be discrete components mounted internally or externally to the finished package, or they may be integrated either within the MEMS structure or within the standard integrated circuit structure.

There is shown in FIG. 1 a galvanically isolated signal conditioning system 10 including a signal conditioning circuit 12 and MEMS switching device 14. Signal conditioning circuit 12 may include a difference circuit and/or an A/D converter and be made by a CMOS process on silicon chip 16. MEMS switching device 14 is stacked on chip 16 and may be formed on a silicon on insulation chip (SOI) 23 and bonded to silicon chip 16 by a adhesive or eutectic die attachment 20. MEMS device 14 is typically tested and capped, such as with cap 21, before it is installed on chip 16 containing signal conditioning circuit 12. The complete closure of the combination package may be achieved as shown at dashed line 22.

In operation a sensor 24 attached to some equipment to be monitored 26 provides a voltage $V_{in}(+)$ at terminal 28 and $V_{in}(-)$ at terminal 30. These voltages may contain a high common mode voltage of two or three hundred volts or more, for example, and a representative differential voltage of a few millivolts or even a few volts containing the information to be sensed. These two input voltage signals, $V_{in}(+)$ and $V_{in}(-)$, are applied to input terminals 32, 34 of MEMS switching device 14. MEMS switching device 14 selectively connects flying capacitor 36 to terminals 34 and 32 in one state through contacts 38 and 40 and in a second state to hold capacitor 42 to terminals 48 and 50 through contacts 44 and 46. Hold capacitor 42 may be and typically is associated with or included in the input circuitry of the signal conditioning circuit 12 as shown by hold capacitor 42d in phantom in FIG. 5, infra. The independent selective connection of flying capacitor 36 to either contacts 38 and 40 or contacts 44 and 46 results in the elimination of the common mode voltage and the application to hold capacitor 42 of only the differential input voltage to be sensed. The voltage across hold capacitor 42 appears across terminals 48 and 50 and is communicated over wire bonds 52 and 54 to terminals 56 and 58 of signal conditioning circuit 12. After conditioning for, by example, a difference amplifier circuit or A/D converter the output appears at terminal 60. Terminals 25 and 27 of sensor 24 are also connected to terminal 28 and 30 by wires 63 and 65 in this embodiment.

Figure 2:
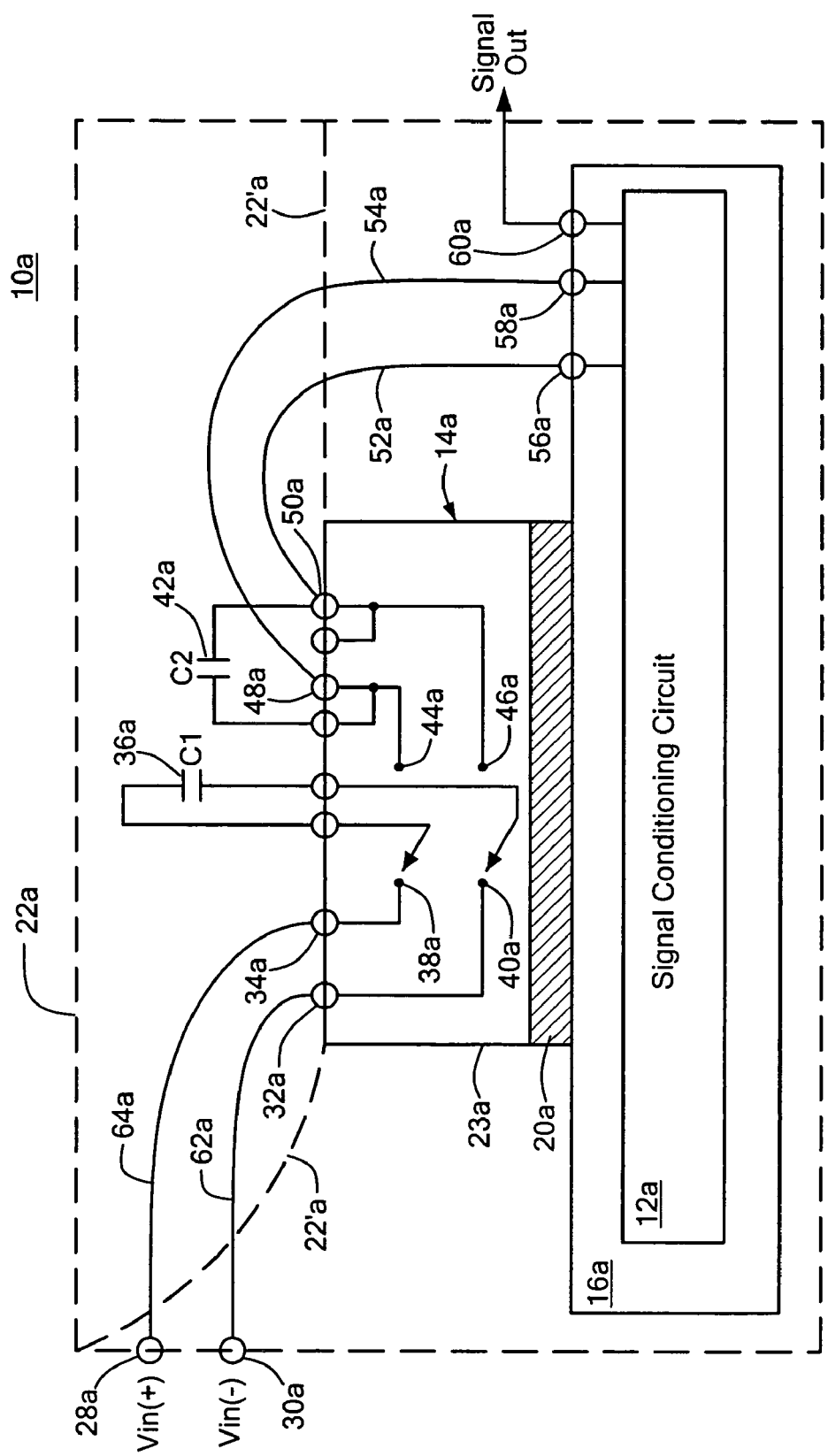
FIG. 2 is a view similar to FIG. 1 with the flying capacitor and hold capacitor external to the MEMS switching device and signal conditioning system.

System 10a, FIG. 2, is identical with system 10 of FIG. 1 except that the flying capacitor 36a and the hold capacitor 42a are mounted external to the MEMS switching device 14a as well as to the signal conditioning circuit 12 on chip 16. Although external to both signal conditioning circuit 12a and MEMS switching device 14a they may still be within the total package as indicated at 22a or they may external to the entire package if the package is reduced as shown at 22'a.

Figure 3:
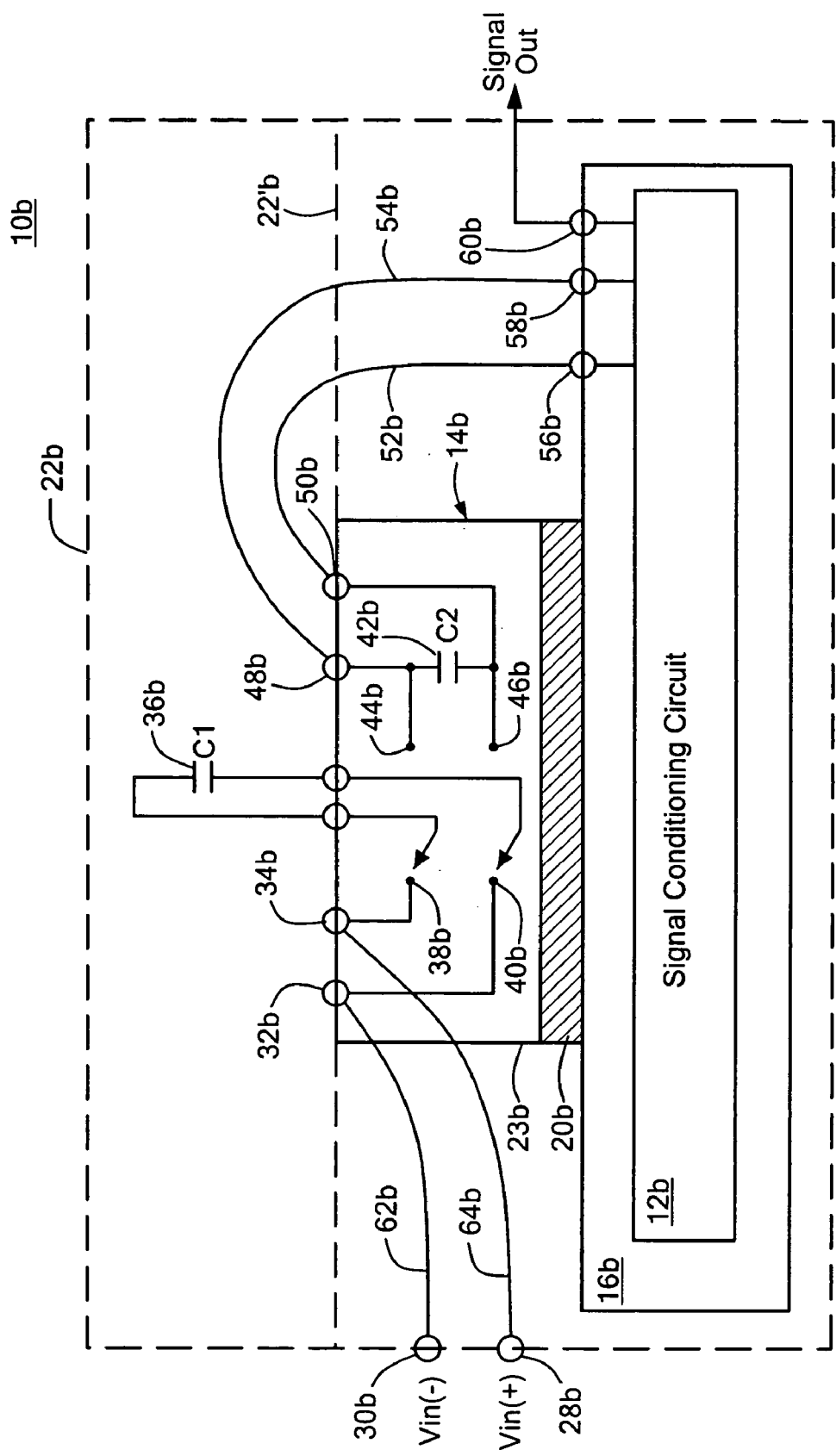
FIG. 3 is a view similar to FIG. 1 with the flying capacitor outside the MEMS switching device and the hold capacitor inside.

Galvanically isolated signal conditioning system 10b, FIG. 3, is similar to systems 10 and 10a except that flying capacitor 36b is external while hold capacitor 42b is internal.

Figure 4:
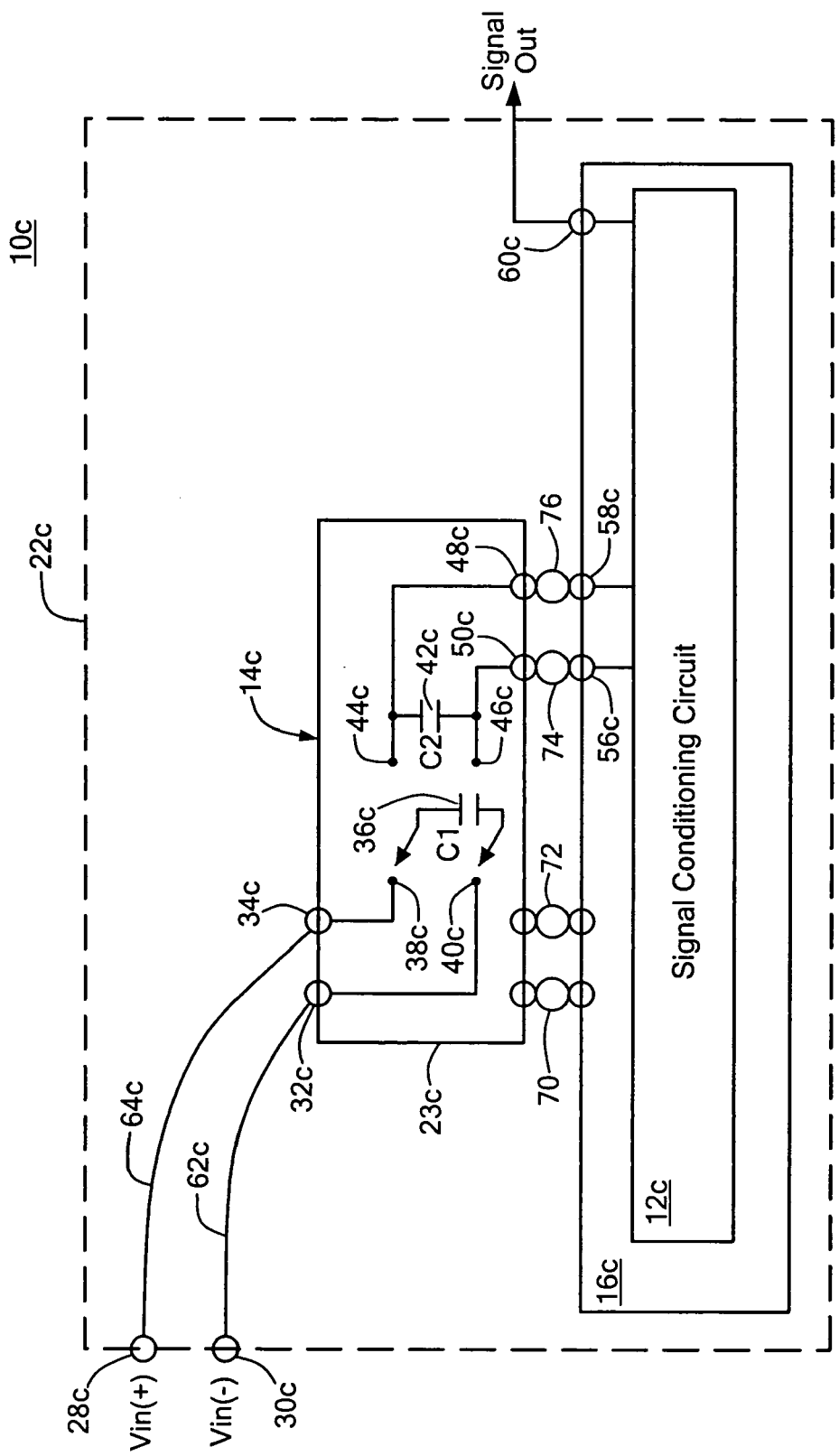
FIGS. 4, 5, and 6 are views similar to FIGS. 1, 2 and 3, respectively, but with the MEMS switching device chip attached to the signal conditioning circuit chip by bump-attach mounting techniques.

Galvanically isolated signal conditioning system, 10c, FIG. 4, is similar to that shown in FIG. 1 except that MEMS switching device 14c is attached to signal conditioning circuit 12c on integrated circuit chip 16c by bump-attach mounting wherein bump-attach mounting bumps such as 70, 72, 74 and 76 make both mechanical and electrical interconnections between MEMS switching device 14c and signal conditioning circuit 12c, chip 16c.

Figure 5:
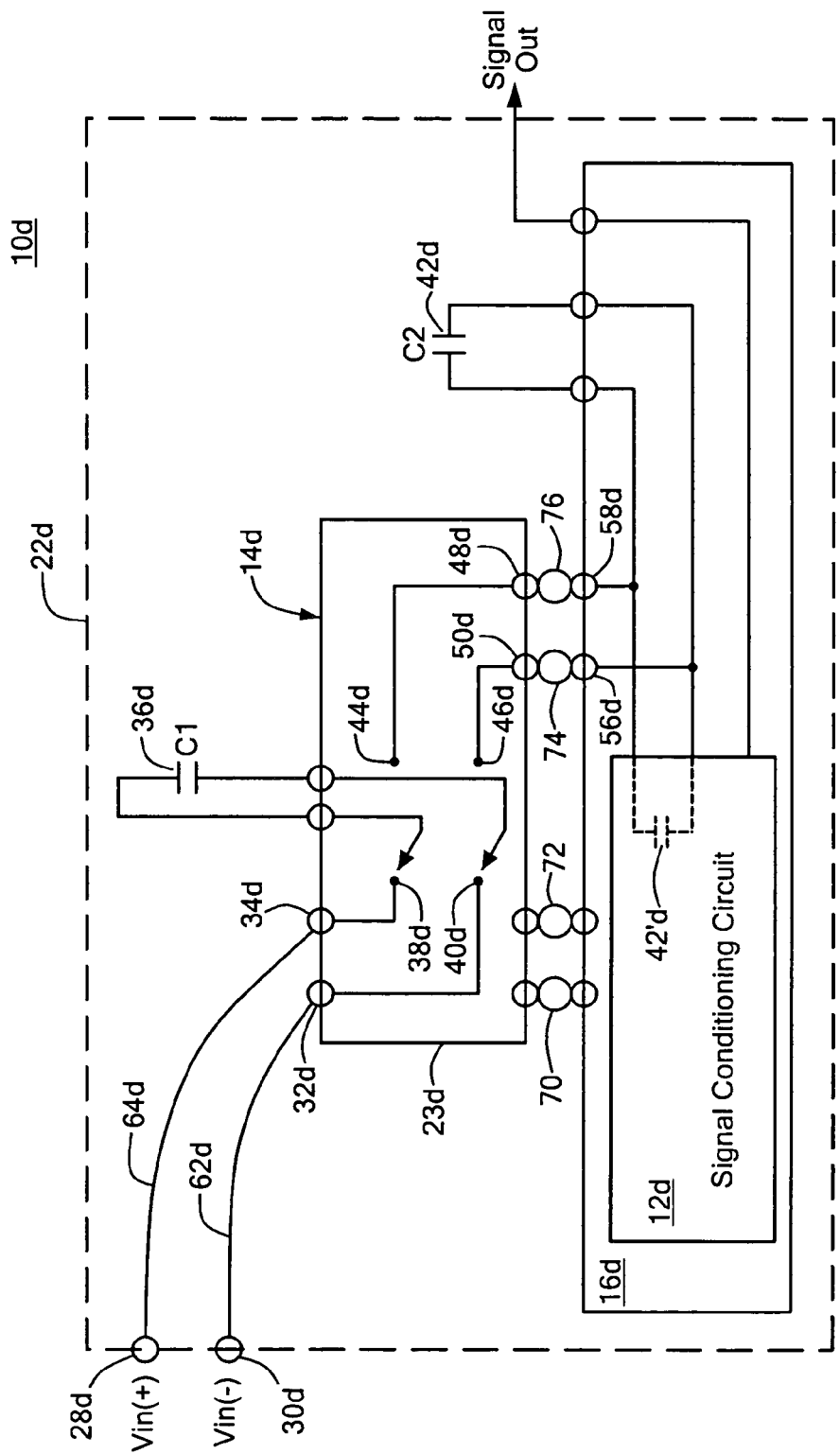
Figure 6:
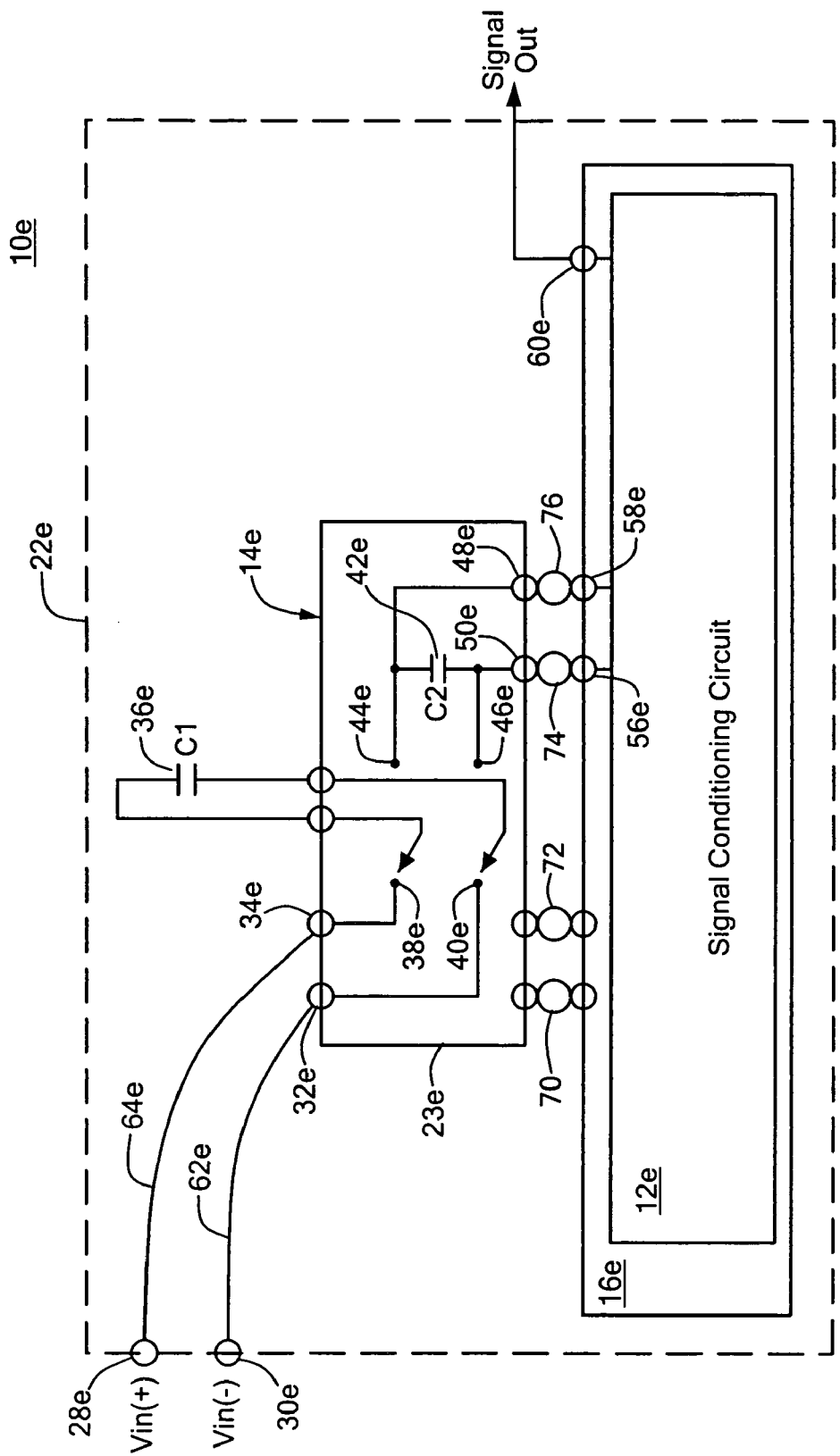

System 10d, FIG. 5, differs from system 10c in FIG. 4 by the fact that the flying capacitor 36d and hold capacitor 42d are both external to the MEMS switching device 14d and the signal conditioning circuit 12d, chip 16d while galvanically isolated signal conditioning system 10e, FIG. 6, differs in that flying capacitor 36e is external to MEMS switching device 14e while hold capacitor 42e is carried by the MEMS switching device 14e.

Figure 7:
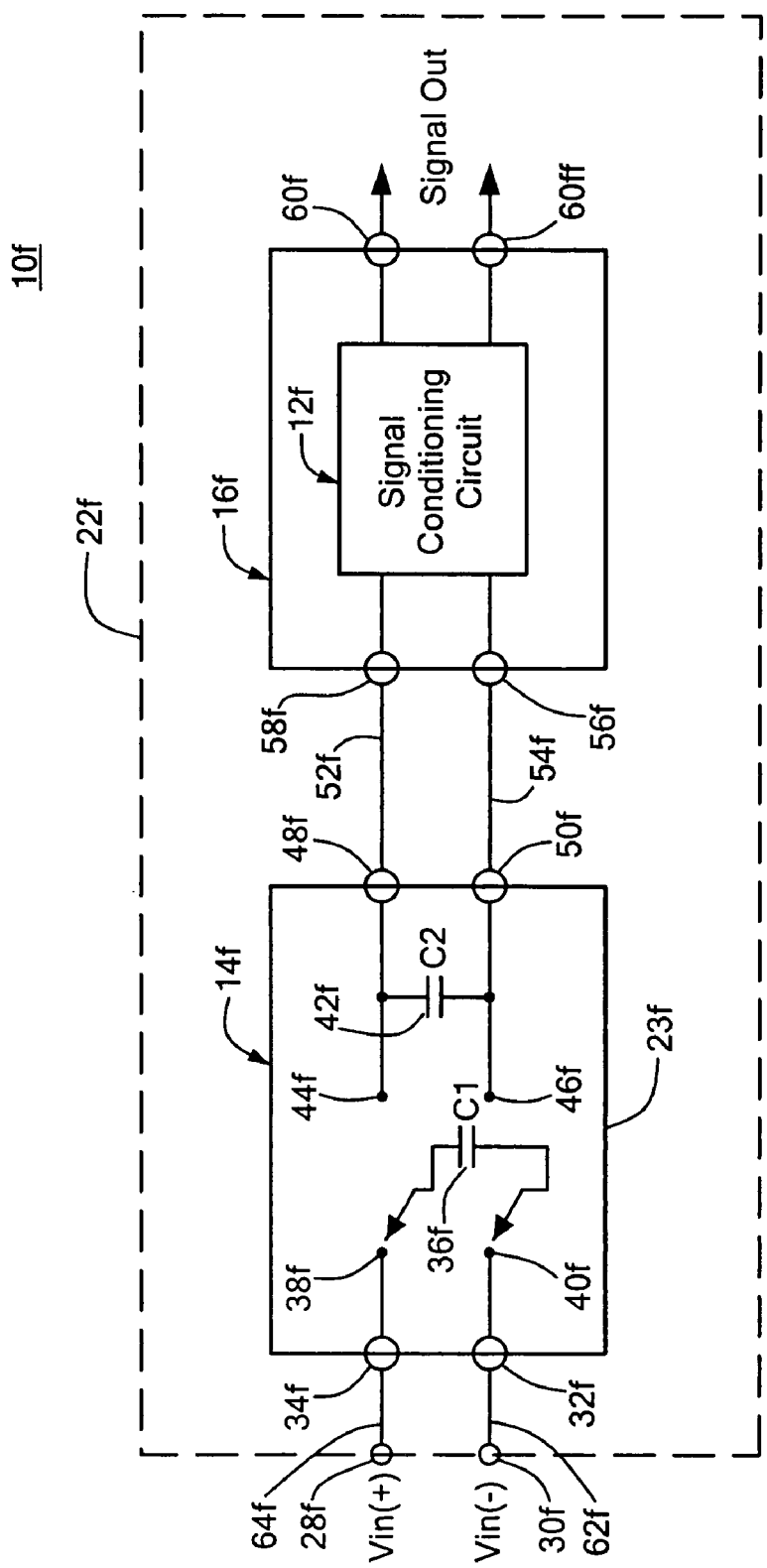
FIGS. 7, 8, and 9 are views similar to FIGS. 1, 2, and 3, respectively, but with the MEMS switching device and signal conditioning circuit on adjacent chips.

Galvanically isolated signal conditioning system 10f, FIG. 7, similar to the previous embodiments shows signal conditioning 12f and MEMS switching device 14f mounted on CMOS chip 16f and SOI chip 23f respectively. Here, however, in contrast to the previous stacked arrays chips 16f and 23f are adjacent to one another and interconnected by wire bonds 52f and 54f.

Figure 8:
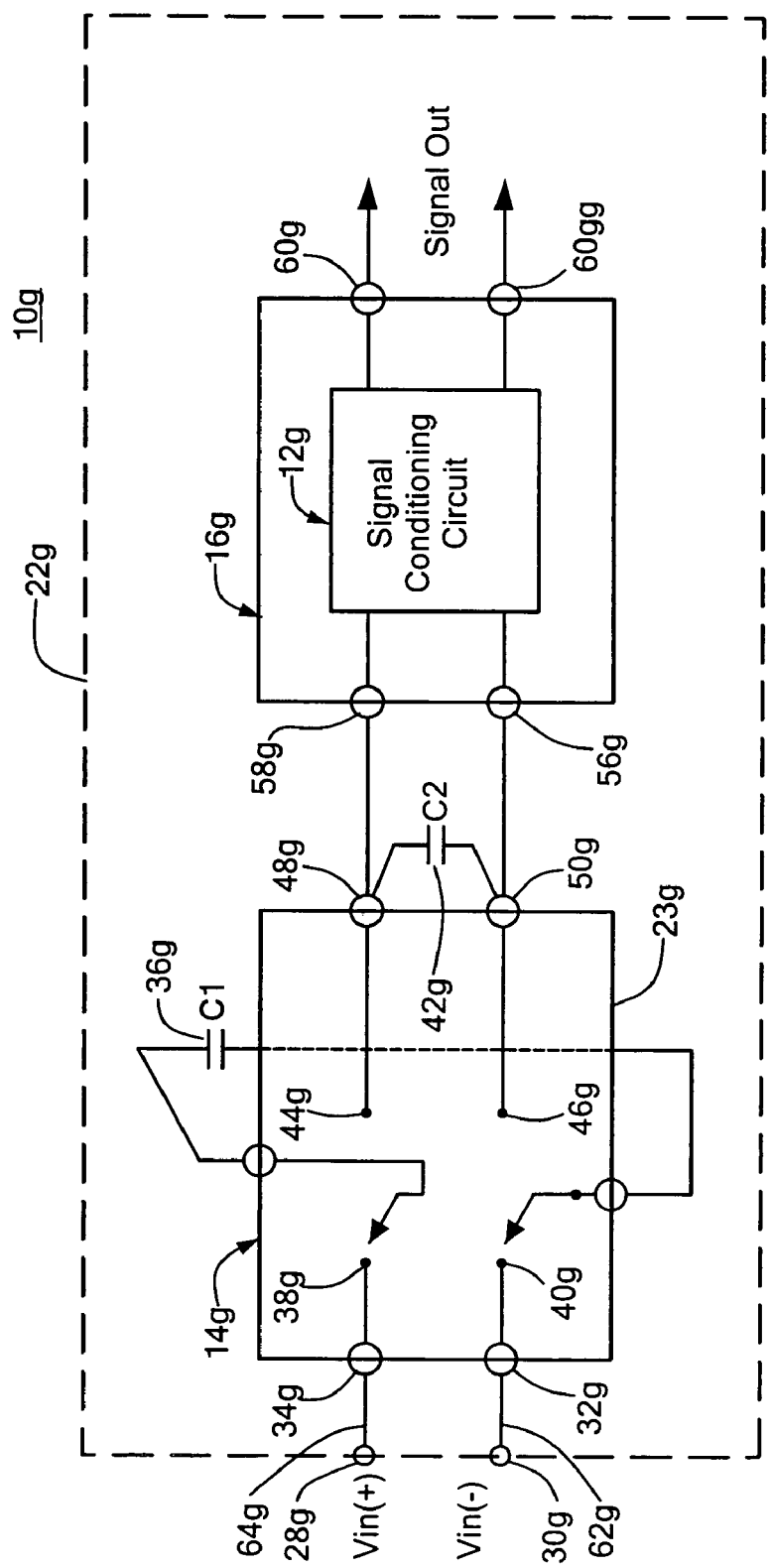
Figure 9:
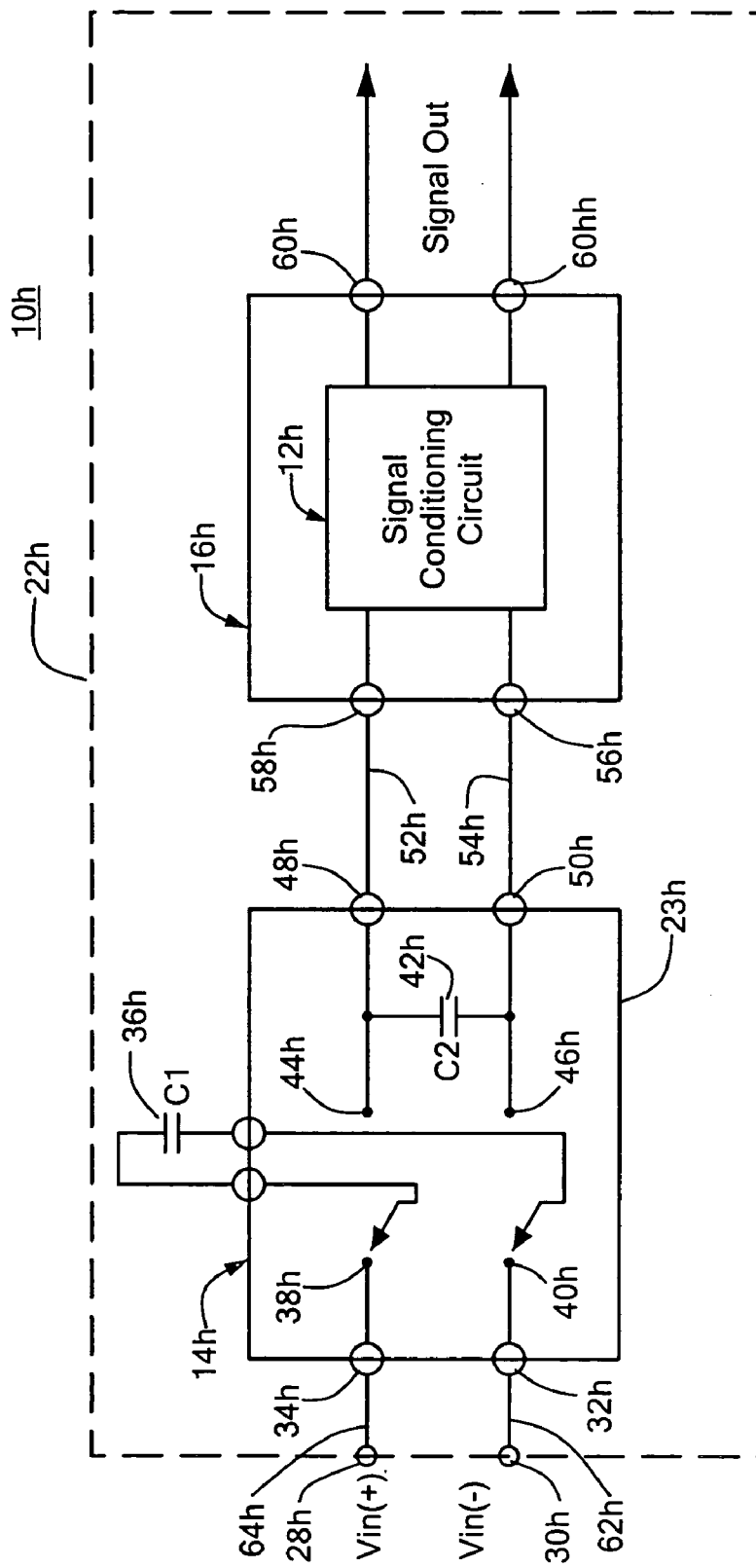

Galvanically isolated signal conditioning system 10g, FIG. 8, is similar to that shown in FIG. 7 except that flying capacitor 36g and hold capacitor 42g are both now carried externally to MEMS switching device 14g. The similarity prevails with respect to galvanically isolated signal conditioning system 10h, FIG. 9, wherein flying capacitor 36h is still carried externally to MEMS switching device 14h but hold capacitor 42h is now carried internally.

Figure 10:
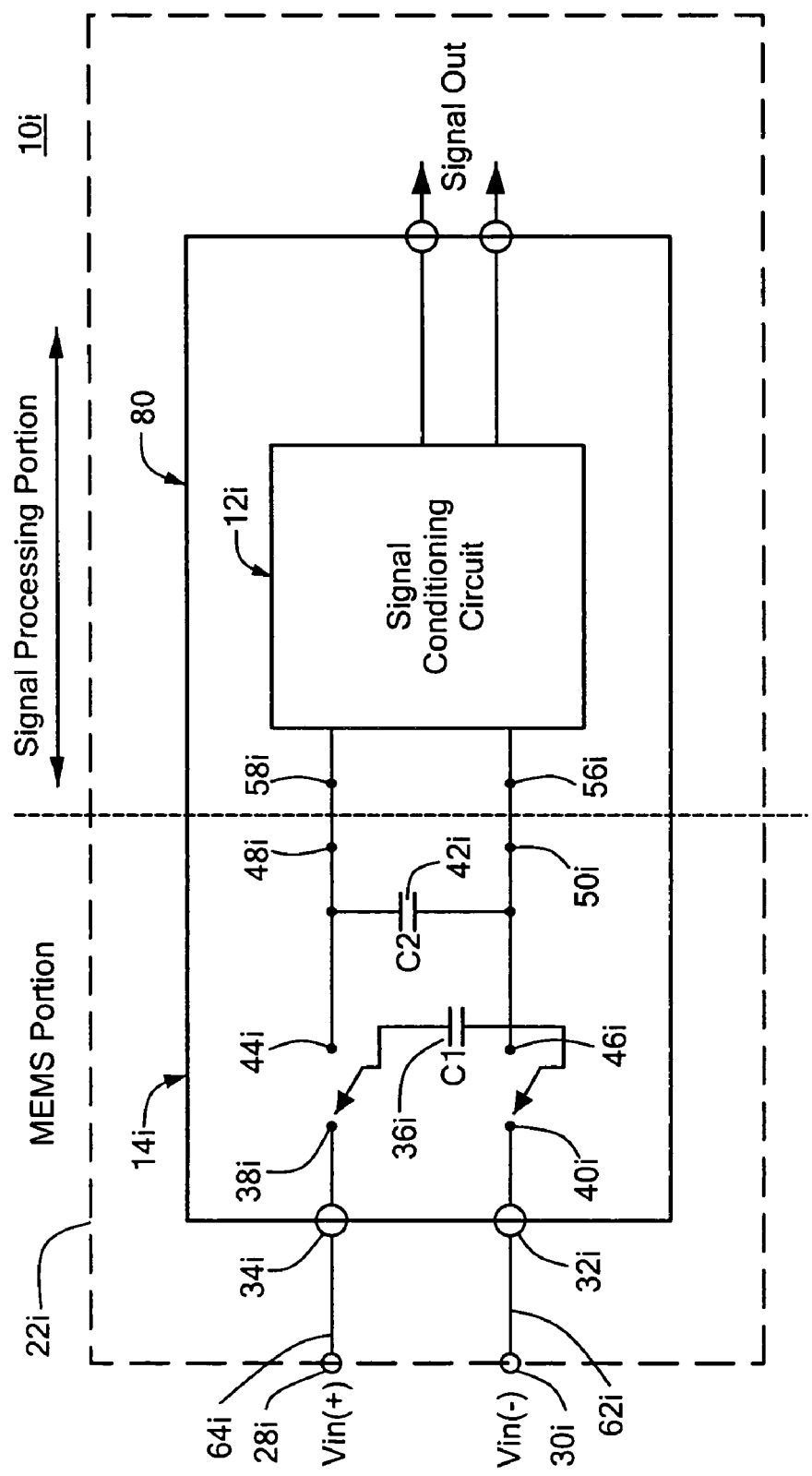
FIGS. 10, 11 and 12 are views similar to FIGS. 1, 2, and 3, respectively, but with the MEMS switching device and signal conditioning circuit on the same chip.
Figure 11:
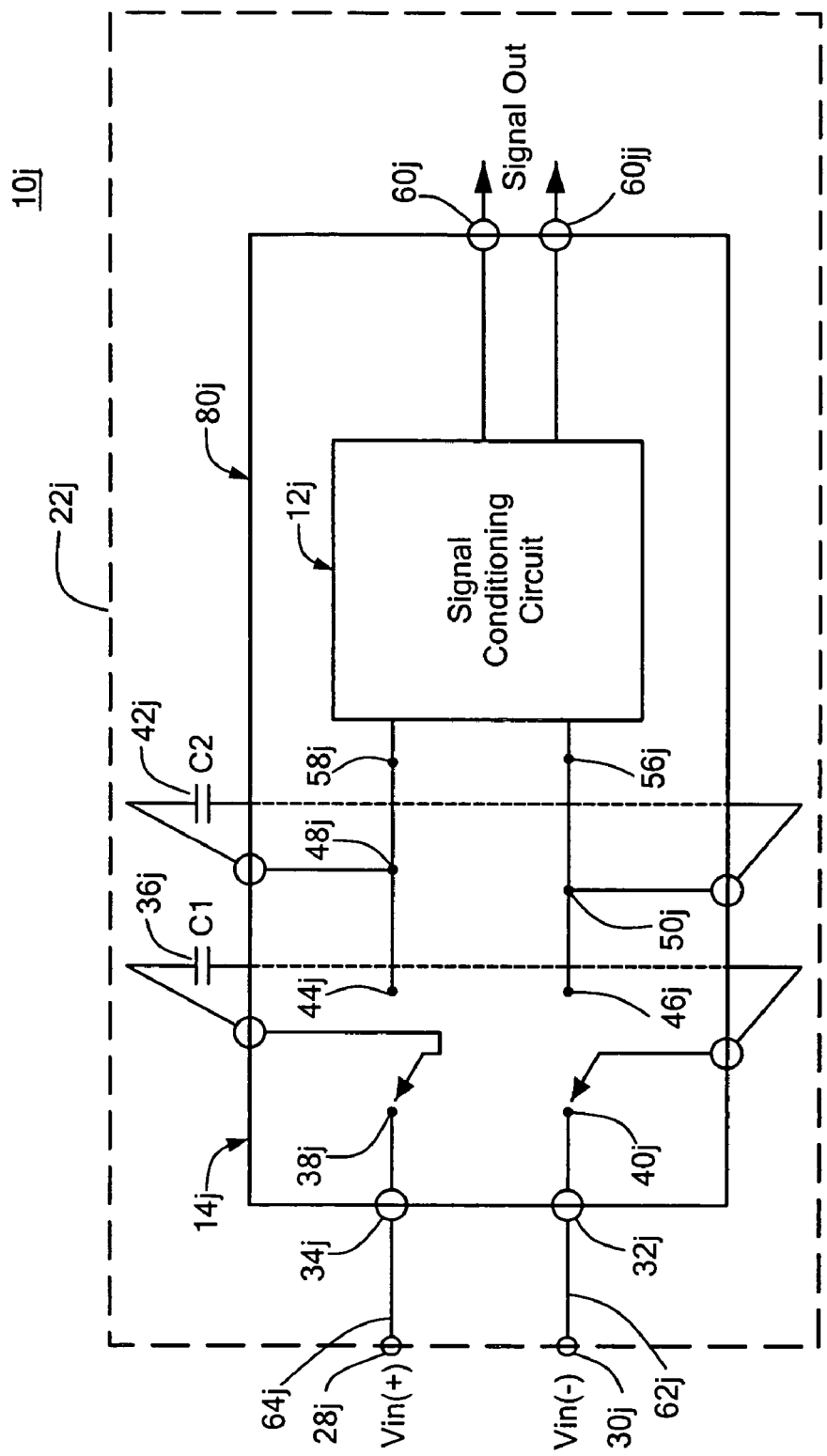
Figure 12:
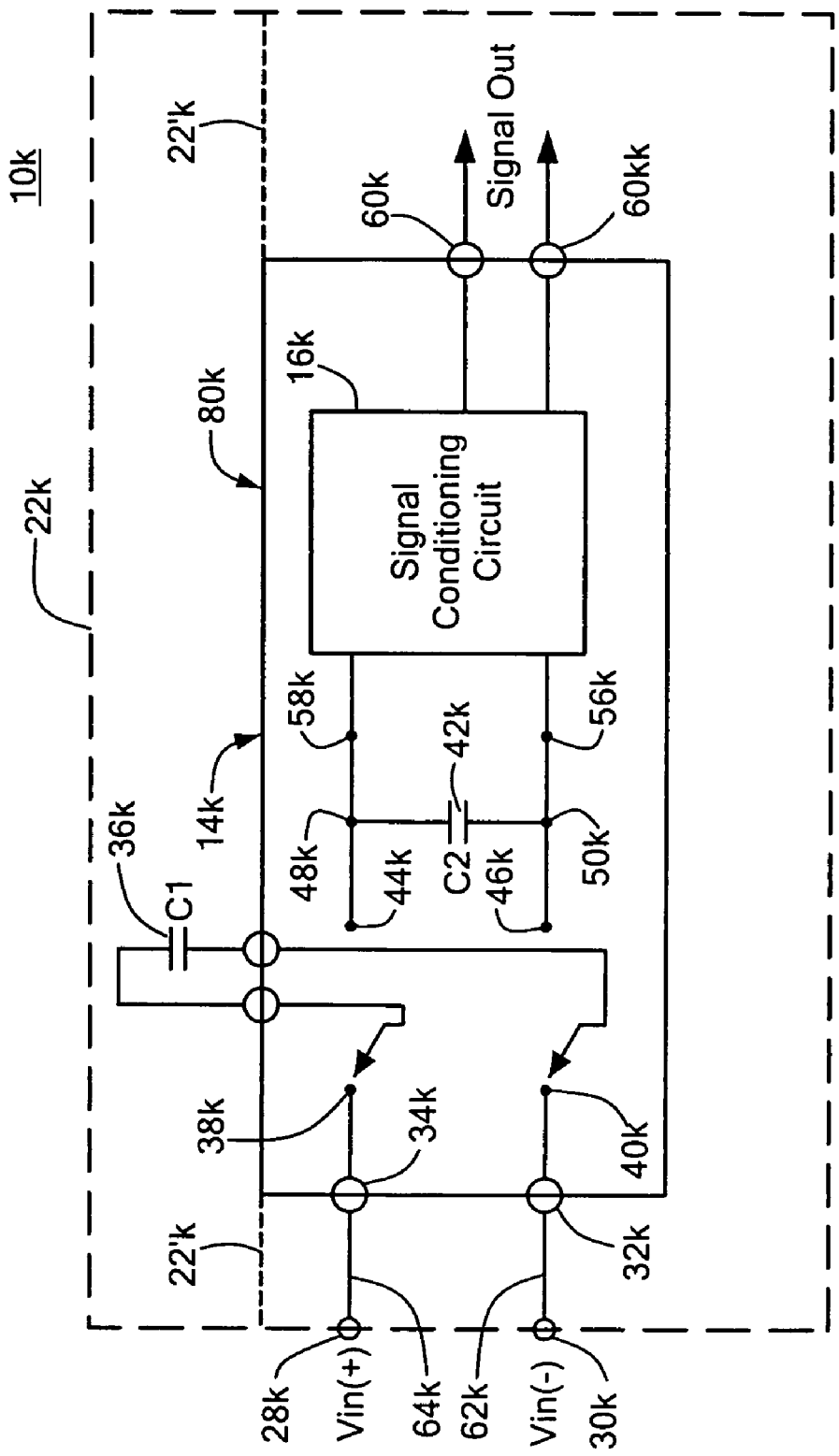

While so far the small compact package of the galvanically isolated signal conditioning system has been illustrated with the signal conditioning circuit and the MEMS switching device on separate, although closely proximate chips, made by different processes, this is not a necessary limitation of the invention. For example, as shown with respect to galvanically isolated signal conditioning system 10i, FIG. 10, both the signal conditioning circuit 12i and the MEMS switching device 14i can be constructed on a single chip 80 of, for example, the silicon on insulator (SOI) process. This becomes even more appealing and economical according as the MEMS switching device occupies more of the area of the chip. The construction can be the same as previously with both the flying capacitor 36i and hold capacitor 42i being disposed with the MEMS switching device 14i or as shown in galvanically isolated signal conditioning system 10j, FIG. 11, both flying capacitor 36j and hold capacitor 42j may be externally disposed with respect to MEMS switching device 14j as well as signal conditioning circuit 12j. Alternatively, as shown in galvanically isolated signal conditioning system 10k, FIG. 12, flying capacitor 36k can be externally associated while hold capacitor 42k is internally associated with MEMS switching device 14k and signal conditioning circuit 16k on chip 80k.

Figure 13:
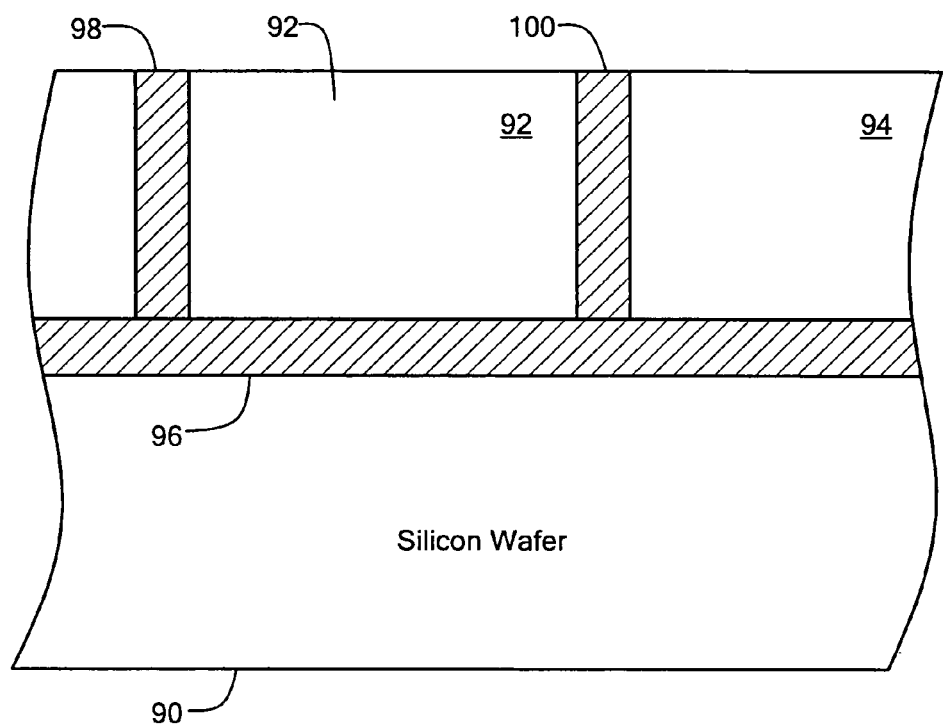
FIG. 13 is a schematic side view of a portion of a MEMS switching device, useable in this invention, illustrating its construction on a silicon on isolation (SOI) chip.
Figure 14:
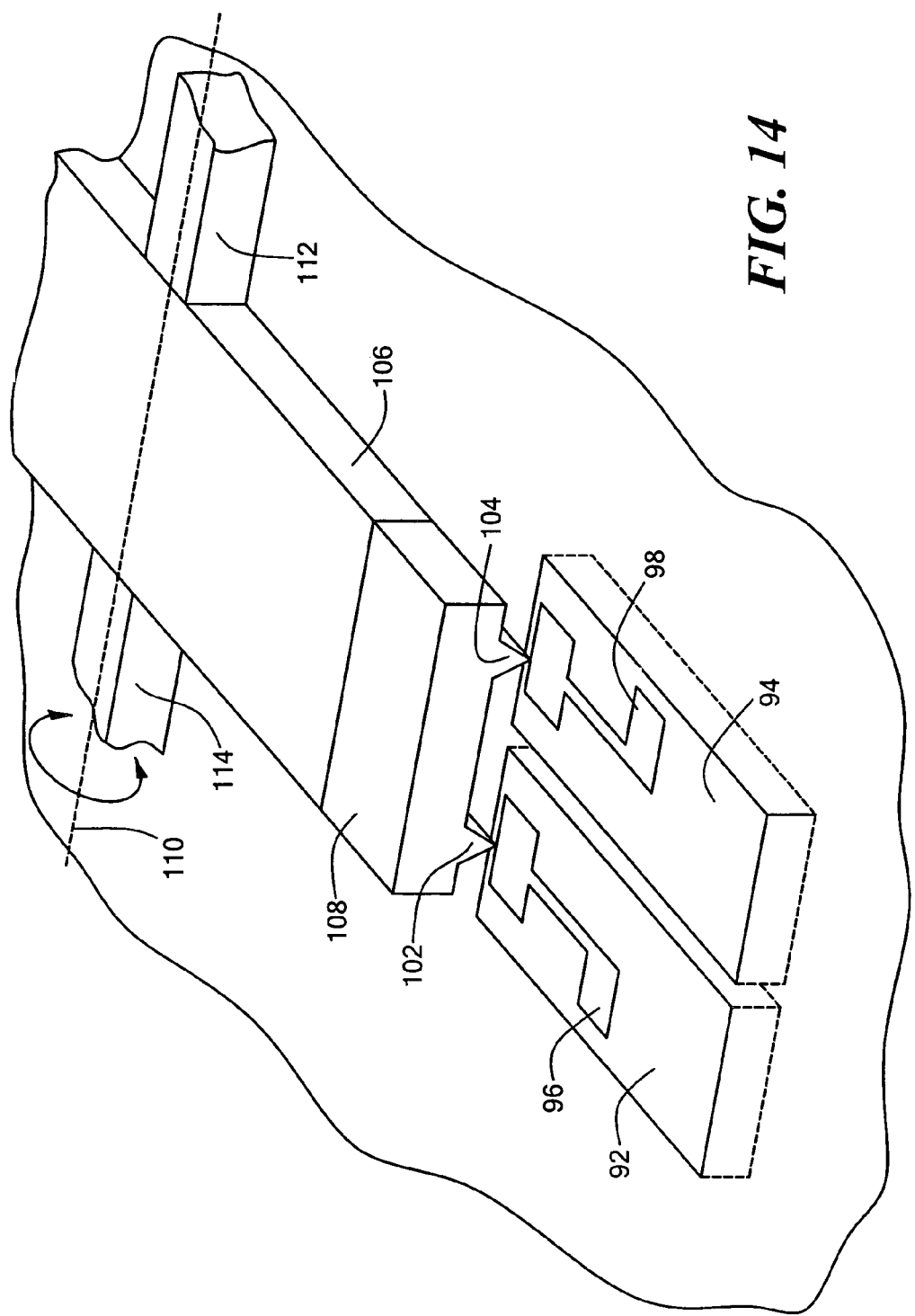
FIG. 14 is a schematic side view of a single switch element implementable in the MEMS switching device of FIG. 13.

A typical MEMS device, for use with this invention, is constructed using a SOI or silicon on insulator process as shown in FIG. 13 where as silicon wafer 90 contains isolated pockets or wells of silicon 92, 94 defined by a buried oxide layer 96 typically 1-5 μm of oxide joined by one or more etched and filled trenches 98, 100, typically consisting of an oxide and nitride combination and about 2 μm in width. A simple switching device utilizing these elements would have contact 102, FIG. 14, connected with one pocket 92 and a second contact 104 connected with pocket 94. Pockets 92 and 94 have metalization patterns, 96 and 98, laid down on their surfaces, respectively. Contacts 102 and 104 are electrically connected together via the conductive material 108 from which they are both made. Contact 108 is attached to actuator beam 106 which may be made from a different material to that of contact 108.

Figure 15:
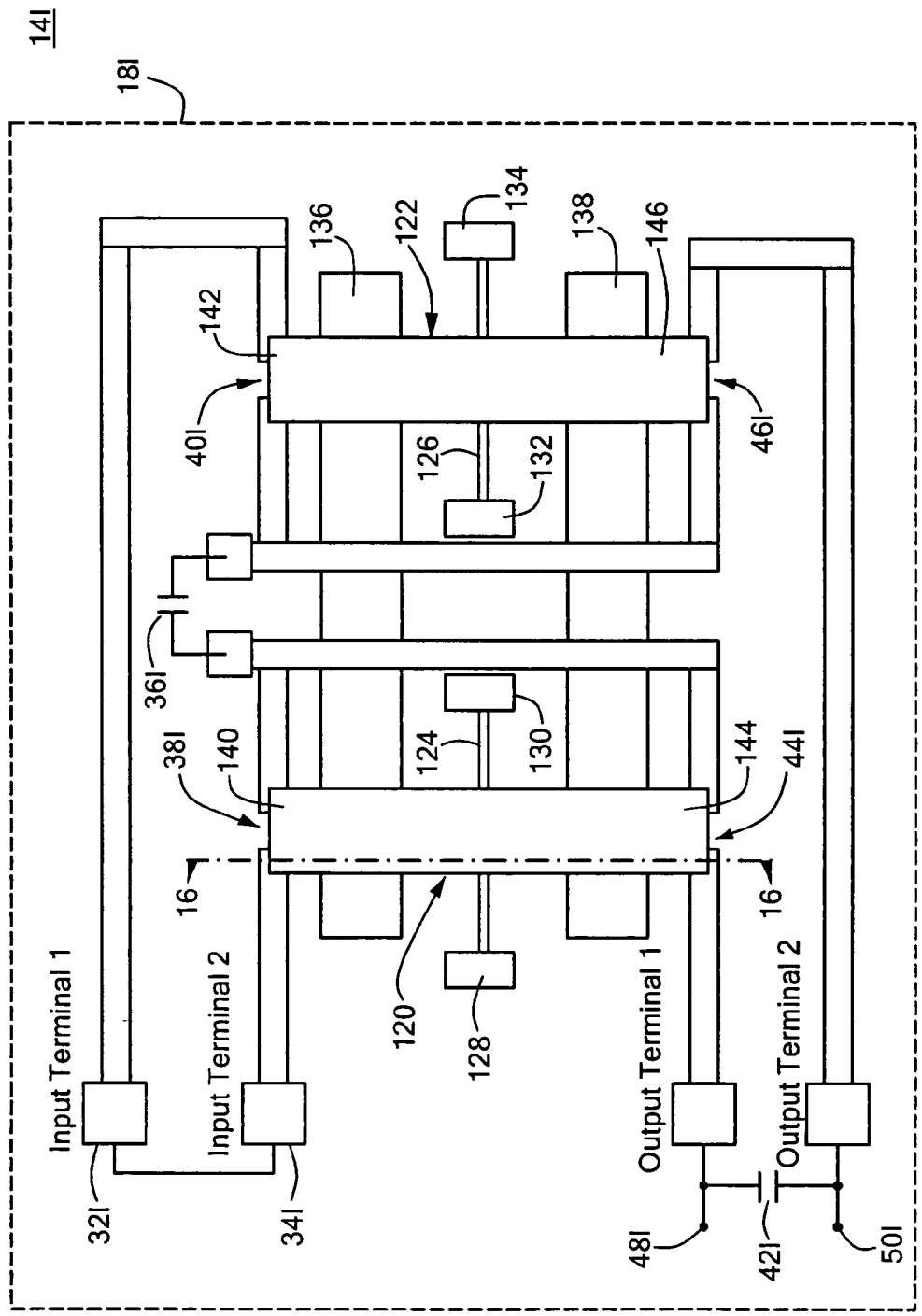
FIG. 15 is a schematic plan view of a cantilevered MEMS switching device useable in this invention.

This actuator beam has a hinge or pivot axis shown at 110 and opposing pivot points 112 and 114 around which the actuator beam physically pivots or rotates. When suitable actuation signals are applied to beam 106, the beam pivots anti-clockwise around 110 and brings contacts 102 and 104 simultaneously into contact with their respective metalization patterns 96 and 98 in respective pockets 92 and 94. Thus, metalization pattern 96 is electrically connected to metalization pattern 98. When other suitable actuation signals are applied to beam 106, the beam pivots clockwise around axis 110, moving contacts 102 and 104 away from the pockets 92 and 94, thereby breaking the electrical connection between metalization pattern 96 and 98. This is the make and break action of a single MEMS switch. The MEMS switching device 141, FIG. 15, contains four such switches. A schematic plan view of such an implementation of the devices of FIGS. 1 through 12 is shown in FIG. 15 where MEMS switching device 141 is shown as including a pair of MEMS cantilevered beams 120 and 122 which are swingable about hinges 124 and 126 mounted to fixed supports 128, 130 and 132, 134, all respectively, which are operated essentially as double throw switches by selective operation of actuating pads 136 and 138.

Figure 16:
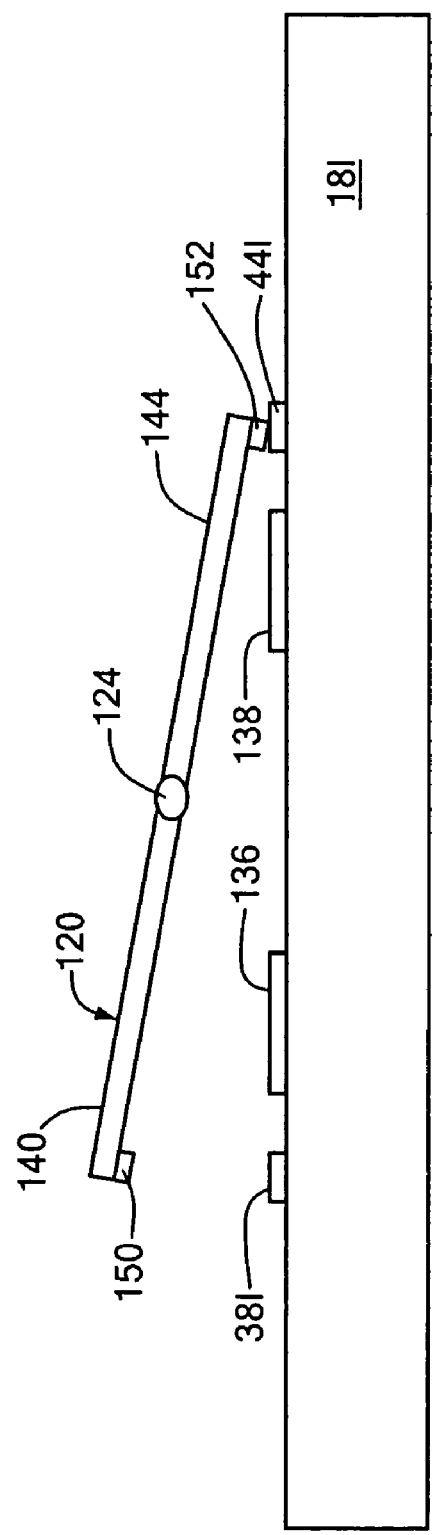
FIG. 16 is a schematic cross-sectional elevational view along lines 16-16 of FIG. 15 of a MEMS switching device useable in this invention.

In operation when actuating pad 136 is energized, ends 140 and 142 of beams 120 and 122 are brought down to close the contacts at 381 and 401, thereby connecting flying capacitor 361 across the input terminals 321 and 341. At this time, the other ends 144 and 146 of cantilever beams 120 and 122 do not close contacts 441 and 461. When present actuating pad 136 is de-energized or deactivated and next actuating pad 138 is energized ends 140 and 142 lift opening the contacts at 381 and 401. At this time beam ends 144 and 146 are brought down to close the contacts 441 and 461 thereby connecting flying capacitor 361 to terminals 481 and 501. The cantilever nature of beam 120 is shown more clearly in FIG. 16, where the switch contact metalization 150, 152 that bridges contact 381 and 441 can be seen.

A significant advantage of using the MEMS switching device is the scalability of the on-resistance of a MEMS switch compared to the on-resistance of a solid state switch. On-resistance is the electrical resistance (in Ohms) of the electrical switch when it is in the on state. It is a cause of energy loss (power/heat dissipated in the switch) and in a flying capacitor architecture it is a cause of delay in charging the capacitor 36 to the input voltage. This delay is controlled by the product of the capacitance (C) of the sampling capacitor (which must be large for a flying capacitor circuit) and the resistance (R) of the switches, the so-called RC time constant. The time required to charge the capacitor will limit the speed of the switching circuit (i.e. it must not switch before the capacitor has had time to fully charge/discharge). The switching speed will determine what frequency of input signal can be measured, i.e. the faster the circuit can switch, the higher the frequency of the input signal that can be measured. Given that the capacitance is of necessity large, then it is desirable to minimize the switch on-resistance to allow the highest possible frequency of signal to be measured In a mechanical switch, the electrical contact resistance (Rc), which is equivalent to the on-resistance of a solid state switch, is a function of the resistivity of the contact metalization (p), the metalization hardness (H) and the force with which the contact surfaces are pushed together (F), in mathematical terms $$Rc = P\sqrt{\pi H/4F}$$

Note that the dimensions of the switch are not in this formula, therefore the dimensions of the switch do not need to be increased to decrease the on-resistance. The metalization properties and the contact force are the determining factors.

For a solid state switch, the on-resistance is a function of the dimensions of the switch, specifically, for any given solid state technology, an FET switch on-resistance is inversely proportional to the width of the switch. To make a switch with a lower on-resistance, it is necessary to increase the switch size.

This fundamental difference in the way the on-resistances of a MEMS switch and a solid state switch are controlled present the possibility for creating a low on-resistance switch with a MEMS structure in a smaller area than a solid state switch with equivalent resistance.

Another important benefit offered by the MEMS switch of this invention used in a flying capacitor circuit is that it is inherently "failsafe". In a standard solid state implementation of the flying capacitor circuit the voltage on the two inputs, $V_{in}(+)$ and $V_{in}(-)$, (which is the signal voltage plus the unwanted common mode voltage) is switched onto the two plates of the flying capacitor by closing a first pair of FET switches controlled by a first signal. The flying capacitor is charged to the value of the differential input signal voltage (the common mode voltage is rejected) and then the first pair of switches are opened and a second pair of switches are closed by a second signal. This transfers the required differential signal voltage to the output.

A potential problem with this is that in the case of leakage of the FET switches or failure of the control signals, it is possible for a direct path to exist from input to output through the FET switches. This results in a loss of isolation, incorrect voltages appearing at the output and potential damage to the electrical circuits connected to the output.

The use of two MEMS switches of the type shown in FIG. 15, in place of solid state switches mean that this type of failure cannot occur. The use of the MEMS switches guarantees that there is mechanical isolation between the input and output terminals in the case of a fault condition on the controlling logic.

The fact that the switch terminals are on a cantilever mean that only one side of the switch can be making physical and electrical contact at any one time. Even if the control signals fail, the switch cannot physically (or electrically) connect the flying capacitor to the input and the output at the same time. This is a guarantee that even in the case of failure of the control electronics, galvanic isolation is maintained. This failsafe against electronic failure is not possible with the solid state circuit implementation.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

Other embodiments will occur to those skilled in the art and are within the following claims.

What is claimed is:

1. A galvanically isolated signal conditioning system for data acquisition, the system comprising:
   a signal conditioning circuit on an integrated circuit chip;
   a flying capacitor; and
   a galvanically isolating MEMS switching device on an integrated circuit chip for selectively switching said flying capacitor from across a pair of input terminals in one state to across the input terminals of said signal conditioning circuit in another state, said system isolating a differential voltage from a larger common mode voltage both present at the input terminals.

2. The galvanically isolated signal conditioning system of claim 1 in which said signal conditioning circuit includes an analog to digital converter.

3. The galvanically isolated signal conditioning system of claim 1 in which said signal conditioning circuit includes a difference amplifier circuit.

4. The galvanically isolated signal conditioning system of claim 1 in which said signal conditioning circuit includes a holding capacitor at its input.

5. The galvanically isolated signal conditioning system of claim 1 in which said signal conditioning circuit is on a first chip and said MEMS switching device is on a second MEMS chip.

6. The galvanically isolated signal conditioning system of claim 1 in which said signal conditioning circuit and said MEMS switching device are on the same chip.

7. The galvanically isolated signal conditioning system of claim 5 in which said first chip is a CMOS chip and said second chip is an SOI chip.

8. The galvanically isolated signal conditioning system of claim 6 in which said first chip is an SOI chip.

9. The galvanically isolated signal conditioning system of claim 5 in which said second chip is mounted on said first chip.

10. The galvanically isolated signal conditioning system of claim 9 in which said second chip is electrically connected by wire bonding to said first chip.

11. The galvanically isolated signal conditioning system of claim 9 in which said second chip is electrically connected by bump-attach mounting to said first chip.

12. The galvanically isolated signal conditioning system of claim 5 in which said second chip is disposed adjacent said first chip and is electrically connected to it by wire bonding.

13. The galvanically isolated signal conditioning system of claim 1 in which said flying capacitor is mounted with said MEMS switching device.

14. The galvanically isolated signal conditioning system of claim 1 in which said flying capacitor is mounted external to said MEMS switching device.

15. The galvanically isolated signal conditioning system of claim 1 in which said MEMS switching device is a capped, tested MEMS device.

16. The galvanically isolated signal conditioning system of claim 4 in which said holding capacitor is disposed with said MEMS switching device.

17. The galvanically isolated signal conditioning system of claim 4 in which said holding capacitor is disposed with said signal conditioning circuit.

18. The galvanically isolated signal conditioning system of claim 4 in which said holding capacitor is disposed external to said signal conditioning circuit and MEMS switching device.

19. The galvanically isolated signal conditioning system of claim 4 in which said holding capacitor and said flying capacitor are disposed in said MEMS switching device.

20. The galvanically isolated signal conditioning system of claim 4 in which said holding capacitor and said flying capacitor are external to said MEMS switching device and said signal conditioning circuit.

21. The galvanically isolated signal conditioning system of claim 1 in which said MEMS switching device includes a pair of cantilevered beams.

* * * * *